United States Patent [19]

Berger et al.

[11] 4,346,458

[45] Aug. 24, 1982

[54] I²L MONOLITHICALLY INTEGRATED STORAGE ARRANGEMENT

[75] Inventors: Horst H. Berger, Sindelfingen; Siegfried K. Wiedmann, Stuttgart, both of Fed. Rep. of Germany

[73] Assignee: International Business Machines Corporation, Armonk, N.Y.

[21] Appl. No.: 177,348

[22] Filed: Aug. 12, 1980

[30] Foreign Application Priority Data

Nov. 2, 1979 [DE] Fed. Rep. of Germany ....... 2944141

[51] Int. Cl.³ ........................................... G11C 11/40
[52] U.S. Cl. .................................... 365/174; 365/154; 365/189
[58] Field of Search ............... 365/154, 156, 174, 189, 365/230

[56] References Cited

U.S. PATENT DOCUMENTS

| | | | |
|---|---|---|---|
| 3,531,778 | 9/1970 | Gardner et al. | 340/173 |
| 3,643,231 | 2/1972 | Lohrey et al. | |
| 3,736,477 | 5/1973 | Berger et al. | |
| 3,815,106 | 6/1974 | Wiedmann | |
| 3,816,758 | 6/1974 | Berger et al. | |
| 3,886,531 | 5/1975 | McNeill | |
| 3,993,918 | 11/1976 | Sinclair | |
| 4,021,786 | 5/1977 | Peterson | 340/173 |
| 4,032,902 | 6/1977 | Herndon | 340/173 |
| 4,090,255 | 5/1978 | Berger et al. | |
| 4,158,237 | 6/1979 | Wiedmann | 365/154 |
| 4,193,126 | 3/1980 | Smith | 365/174 |
| 4,223,511 | 9/1978 | Heald | 365/188 |
| 4,228,525 | 9/1980 | Kawarada | 365/174 |
| 4,231,108 | 10/1980 | Suzuki et al. | 365/174 |
| 4,231,109 | 10/1980 | Ono et al. | 365/174 |

FOREIGN PATENT DOCUMENTS

| | | |
|---|---|---|
| 5601 | 11/1979 | European Pat. Off. |
| 6702 | 1/1980 | European Pat. Off. |
| 6753 | 1/1980 | European Pat. Off. |
| 11405 | 5/1980 | European Pat. Off. |
| 8700/77 | 6/1980 | United Kingdom |

OTHER PUBLICATIONS

"A 4K-Bit Static I²L Memory", by K. Kawarada et al., IEEE Transactions on Electron Devices, vol. ED-26, No. 6, Jun. 1979, pp. 886-892.

"A 16Kb Static MTL/I²L Memory Chip", by S. K. Wiedmann et al., IEEE ISSCC Feb. 15, 1980, pp. 222-223, 276.

"Design Considerations for a High-Speed Bipolar READ-ONLY Memory", by J. C. Barrett, et al., IEEE Journal of Solid State Circuits, vol. SC-5, No. 5, Oct. 1970.

"Integrated Injection Logic: A New Approach to LSI", by Kees Hart and Arie Slob, IEEE Journal of Solid-State Circuits, vol. SC-7, No. 5, Oct. 1972, pp. 346-351.

"I²L Takes Bipolar Integration A Significant Step Forward", by R. L. Horton et al., Electronics, Feb. 6, 1975, pp. 83-90.

"Integrated Injection Logic Shaping Up As Strong Bipolar Challenge to MOS", Electronic Design 6, Mar. 15, 1974, pp. 28 and 30.

IBM Technical Disclosure Bulletin publication "MTL Storage Cell", by S. K. Wiedmann, Jun. 1978, vol. 21, No. 1, pp. 231-232.

IBM Technical Disclosure Bulletin publication "Active Injection Memory Cell", by R. Remshardt et al., vol. 22, No. 2, Jul. 1979, pp. 617-618.

IBM Technical Disclosure Bulletin publication entitled "I²L/MTL Storage Cell Layout", by H. H. Berger et al., vol. 22, No. 10, Mar. 1980, pp. 4604-4605.

"Merged-Transistor Logic (MTL)-A Low-Cost Bipolar Logic Concept", by H. H. Berger and S. K. Wiedmann, IEEE Journal of Solid-State Circuits, vol. SC-7, No. 5, Oct. 1972, pp. 340-346.

*Primary Examiner*—Terrell W. Fears
*Attorney, Agent, or Firm*—Wesley DeBruin

[57] ABSTRACT

Monolithically integrated storage arrangement with storage cells arranged in a matrix and consisting of two cross-coupled I²L structures (T1, T2 and T1', T2') each in the manner of a flip-flop, wherein the read signal is derived from the charge carrier current reinjected into the injection zone (P1 or P1') of the respective conductive inverting transistor (T1 or T1') and thus into the connected bit line (BL0, BL1). The storage cells of a matrix line are selected via a common address line (X) coupled to the emitters (N1, N1′) of the inverting transistors (T1, T1′) of said storage cells.

In spite of the fact that the structures have minimum area requirements, a high read signal is obtained by subdividing the address line (X) into two partial word lines (X1, X2). One partial word line (X1) is connected to all emitters (N1) of the inverting transistors (T1) of one $I^2L$ structure of all storage cells of a matrix line. The other partial word line (X2) is correspondingly connected to the emitters (N1′) of the inverting transistors (T1′) of the respective other $I^2L$ structure of the storage cells of the matrix line. Subsequent to a group of storage cells, each of the two partial address lines (X1, X2) is connected to the common address line (X) via a resistor (RX).

14 Claims, 7 Drawing Figures

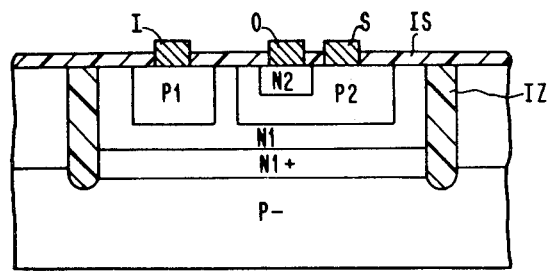
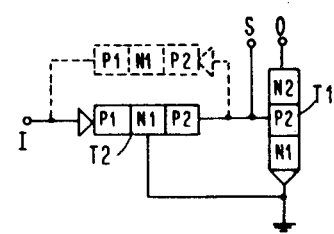
FIG. 1A  FIG. 1B
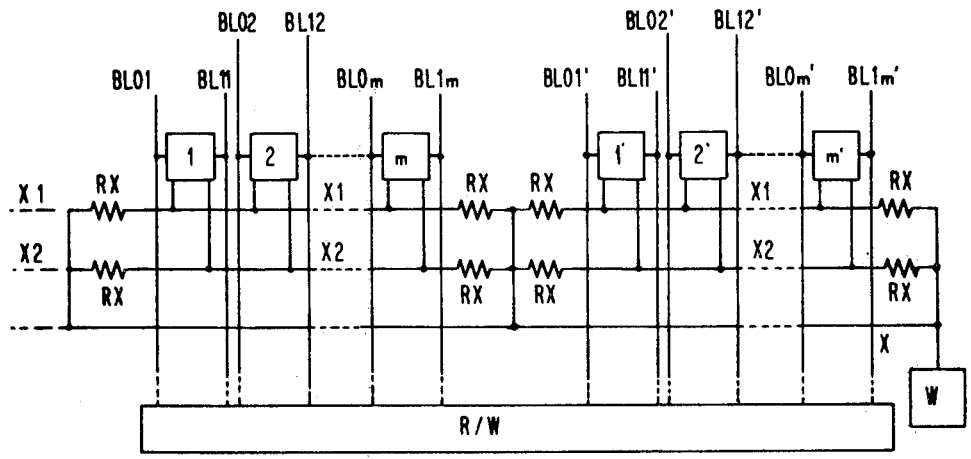
FIG. 2
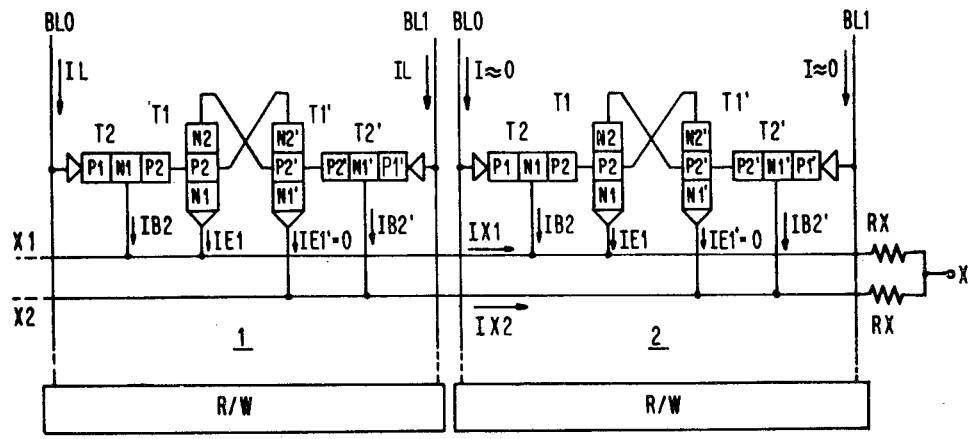
FIG. 3

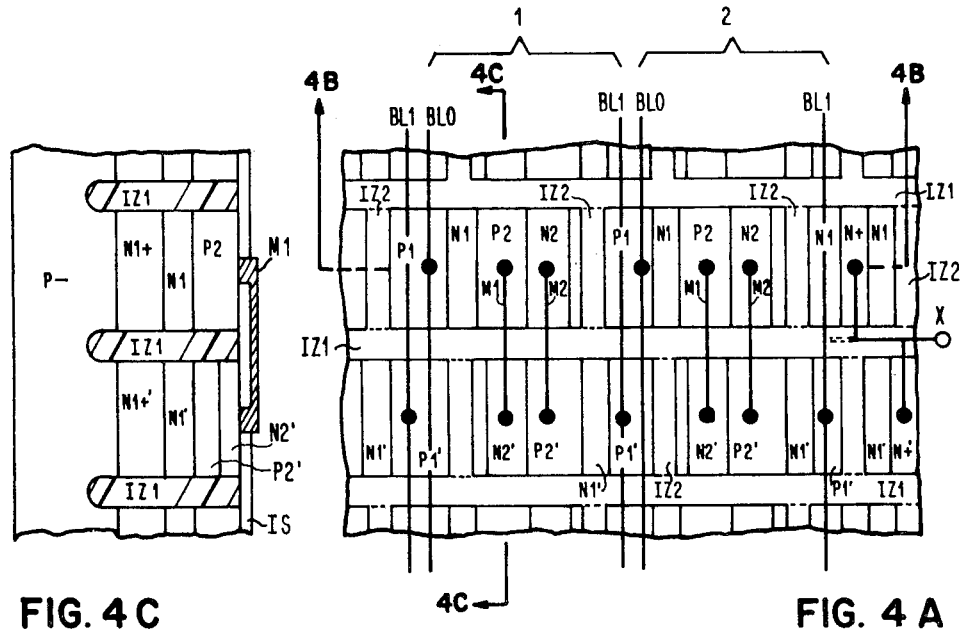
FIG. 4C  FIG. 4A
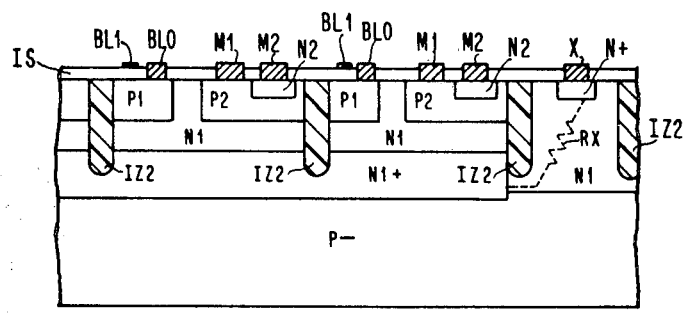
FIG. 4B

I²L MONOLITHICALLY INTEGRATED STORAGE ARRANGEMENT

FIELD OF THE INVENTION

The invention relates to a monolithically integrated store having I²L storage cells.

CROSS REFERENCE TO RELATED INVENTIONS

U.S. Patent Application Ser. No. 101,366 (GE 9-78-021) entitled "Method and Circuit Arrangement For Controlling An Integrated Semiconductor Memory" filed Dec. 7, 1979 by K. Heuber and S. K. Wiedmann and of common assignee herewith.

U.S. Patent Application Ser. No. 136,859 (GE 9-78-036) entitled "Method of And Circuit Arrangement for Reading And/Or Writing An Integrated Semiconductor Storage with Storage Cells in MTL Technology" filed Apr. 3, 1980 by H. H. Heimer et al., and of common assignee herewith.

U.S. Patent Application Ser. No. 133,383 (GE 9-79-004) entitled "Integrated Semiconductor Memory and Method of Operating Same" filed Mar. 24, 1980 by H. H. Heimer et al., and of common assignee herewith.

U.S. Patent Application Ser. No. 924,126 (FR 9-77-0301 - French Patent Application 77/29867) entitled "Semiconductor Integrated Injection Logic Structure Controlled by the Injector" filed July 13, 1978 by R. M. Hornung et al., and of common assignee herewith.

U.S. Patent Application Ser. No. 186,829 entitled "Circuit Including At Least Two MTL Semiconducting Devices Showing Different Rise Times and Logic Circuits Made-Up Therefrom" by Gerard Lebesnerais filed Sept. 12, 1980.

U.S. Patent Application Ser. No. 179,581 entitled "Circuit Arrangement for Capacitive Read Signal Amplification In An Integrated Semiconductor Store with Storage Cells in MTL Technology" filed Aug. 21, 1980 by R. Brosch et al.

U.S. Patent Application Ser. No. 27,223 (GE 9-78-005) entitled "Monolithically Integrated Semiconductor Structure" filed Apr. 5, 1979 by K. Heuber et al., and of common assignee herewith.

BACKGROUND OF THE INVENTION AND PRIOR ART

Further, this technology (MTL or I²L) and its various applications has been described in a number of U.S. Patents and Publications, a number of which are identified below:

U.S. Pat. No. 3,643,231 entitled "Monolithic Associative Memory Cell" granted Feb. 15, 1972 to F. H. Lohrey and S. K. Wiedmann, and of common assignee herewith. The Lohrey et al patent discloses an associative memory storage cell having two cross-connected transistors with the word line for the cell connected to the common emitters of the two transistors and having each of the bases of the two transistors connected to the base of an input/output transistor. The emitter of each of these input/output transistors is connected to a separate bit line and the collectors of the input/output transistors are connected together and to the associative sense amplifier. To associatively search the memory, one of the bit lines is lowered. This causes the input/output transistor connected to the lowered bit line to conduct and thereby give a no-match signal to the associative sense amplifier if its base is connected to the base of the conducting one of the two cross-connected transistors and it causes that transistor to remain nonconductive and thereby give a match signal to the associative sense amplifier if it is connected to the base of the non-conducting one of the two cross-connected transistors.

U.S. Pat. No. 3,736,477 entitled "Monolithic Semiconductor Circuit Concept of High Packing Density" granted May 29, 1973 to H. H. Berger and S. K. Wiedmann and of common assignee herewith. The Berger et al patent discloses a monolithic semiconductor circuit comprising a lateral PNP transistor and an inversely operated vertical NPN transistor. The lateral transistor is formed by a pair of mutually spaced P-type regions diffused in an N-type semiconductor body. The collector region has diffused therein a region of N-type and constituting the collector of the vertical transistor. The semiconductor body constitutes the base region of the lateral transistor and the emitter region of the vertical transistor.

U.S. Pat. No. 3,815,106 entitled "Flip-Flop Memory Cell Arrangement" granted June 4, 1974 to S. K. Wiedmann, and of common assignee herewith. The Wiedmann patent discloses a memory cell arrangement which allows the powering of only two row cells at any one time. This results in lower power dissipation in the cells and also permits the driving circuits to operate at a much lower power level, thereby further reducing the power dissipation per chip.

U.S. Pat. No. 3,816,758 entitled "Digital Logic Circuit" granted June 11, 1974 to H. H. Berger and S. K. Wiedmann, and of common assignee herewith. The Berger et al patent discloses a digital logic circuit comprising a first transistor of a predetermined conductivity type and having an emitter, a base and a collector, a second transistor of the opposite conductivity type and having an emitter, a base and a collector, an input adapted to receive a digital logic signal, an output, a current source, means connecting said first transistor emitter to said current source, means connecting said first transistor base to said second transistor emitter, means connecting said first transistor collector and said second transistor base to said input, and means connecting said second transistor collector to said output.

U.S. Pat. No. 3,866,531 entitled "Schottky Loaded Emitter Coupled Memory Cell For Random Access Memory" granted May 27, 1975 to J. L. McNeill. The McNeill patent discloses a memory cell for a random access memory, the cell including a bistable circuit having first and second cross-coupled transistors with plural emitters. One emitter of each of the first and second transistors is coupled in common. The collector loads for the first and second transistors are provided by respective Schottky diodes which enable the differential voltage in the memory cell to remain low and the cell to be unsaturated over an order of magnitude of current increase to provide for a higher ratio of cell read current to cell store current. Additionally, hard saturation of the memory cell which would otherwise increase the write time is eliminated by this construction.

U.S. Pat. No. 3,993,918 entitled "Integrated Circuits" granted Nov. 23, 1976 to A. W. Sinclair. The Sinclair patent discloses a master/slave bistable arrangement which operates on current levels rather than voltage levels and with a single input of clock pulses. There are different bias current levels which are advantageously supplied by multilayer current injection structures in integrated form.

U.S. Pat. No. 4,021,786 entitled "Memory Cell Circuit and Semiconductor Structure Therefore" granted May 3, 1977 to H. W. Peterson. The Peterson patent discloses a memory cell which comprises a word line, a pair of bit lines, a pair of current sources each having a first side coupled to a corresponding one of the bit lines; and a bistable circuit means operatively coupled to the word line and to another side of each of the current sources, whereby the bistable circuit means assumes one stable state upon the application of a voltage on one bit line, and assumes another stable state upon the application of a voltage on the other bit line.

U.S. Pat. No. 4,090,255 entitled "Circuit Arrangement For Operating A Semiconductor Memory System" granted May 16, 1978 to H. H. Berger et al., and of common assignee herewith. The Berger et al patent discloses a circuit arrangement for operating the read/write cycles of an integrated semiconductor memory storaage system whose storage cells consist of flip flops with bipolar switching transistors, Schottky diodes as read/write elements coupling the cell to the bit lines, and high-resistivity resistors, or transistors controlled as current sources, as load elements, in several phases. This is accomplished through coupling the storage cell to both read/write circuits and restore/recovery circuits via the bit lines and by selective pulsing of the cell with the read/write circuits and the restore/recovery circuits. This permits high speed, low operating current, large scale memory systems to be built.

U.S. Pat. No. 4,158,237 (GE 9-77-016) entitled "Monolithically Integrated Storage Cells" granted June 12, 1979 to S. K. Wiedmann and of common assignee herewith. The Wiedmann patent discloses a monolithically integrated storage cell which includes a flip-flop circuit with two cross-coupled, bipolar switching transistors and one load element each connected by means of one terminal to the collectors of the switching transistors, the storage cell being controlled via a word line connected to the other terminal of both load elements and via one bit line each of a bit line pair connected to the emitter of each switching transistor.

U.S. Pat. No. 4,021,786 entitled "Memory Cell Circuit and Semiconductor Structure Therefore" granted May 3, 1977 to H. W. Peterson. The ABSTRACT of the Peterson patent reads as follows: "A new and improved memory cell is provided which comprises a word line, a pair of bit lines, a pair of current sources each having a first side coupled to a corresponding one of the bit lines, and a bistable circuit means operatively coupled to the word line and to another side of each of the current sources, whereby the bistable circuit means assumes one stable state upon the application of a voltage on one bit line, and assumes another stable state upon the application of a voltage on the other bit line. In addition, several embodiments of semiconductor structures are proveded for the new and improved memory cell".

Reference is made to United Kingdom patent application No. 8700/77 (GE 9-76-005) filed Mar. 2, 1977, publication No. 1,569,800, published June 18, 1980.

IBM Technical Disclosure Bulletin publication entitled "I²L/MTL Storage Cell Layout" by H. H. Berger et al., Vol. 22, No. 10, Mar. 1980, pages 4604–4605.

IBM Technical Disclosure Bulletin publication (GE 8-77-0015) entitled "MTL Storage Cell" by S. K. Wiedmann, Vol. 21, No. 1, June 1978, pages 231–232.

"Merged-Transistor Logic (MTL)—A Low-Cost Bipolar Logic Concept" by Horst H. Berger and Siegfried K. Wiedmann, IEEE Journal of Solid-State Circuits, Vol. SC-7, No. 5, Oct. 1972, pages 341–346.

"Integrated Injection Logic: A New Approach to LSI" by Kees Hart and Arie Slob, IEEE Journal of Solid-State Circuits, Vol SC-7, No. 5, Oct. 1972, pages 346–351.

"I²L Takes Bipolar Integration A Significant Step Forward" by R. L. Horton et al., Electronics, Feb. 6, 1975, pages 83–90.

"I²L Puts It All Together For 10-bit a-d Converter Chip" by Paul Brokaw, Electronics/Apr. 13, 1978, pages 99–105.

"Integrated Injection Logic Shaping Up As Strong Bipolar Challenge to MOS", Electronic Design 6, Mar. 15, 1974, pages 28 and 30.

The invention concerns a monolithically integrated storage arrangement with storage cells arranged in a matrix, which comprise two I²L structures each made up of an injector and an associated inverting switching transistor and connected in the form of a flip-flop by a cross-coupling between the collector of one and the base of the other switching transistor, the operating current and the read/write currents of the storage cells of a matrix column being applied via a bit line pair connected to the injectors of said storage cells, and the selection of the storage cells of a matrix line being effected via a common address line coupled to the emitters of the switching transistors of said storage cells.

The field of logical circuits with bipolar transistors has been marked by considerable progress in recent years, which has attracted the attention of the experts and which under the term MTL (Merged Transistor Logic) or I²L (Integrated Injection Logic) has been referred to extensively in technical literature. Attention is drawn, for example, to the articles in the IEEE Journal of Solid-State Circuits, Vol. SC-7, No. 5, Oct. 1972, pp. 340 ff and 346 ff. Relevant patents are, for example, U.S. Pat. Nos. 3,736,477 and 3,816,758. This injection logic concept is essentially based on inverting single- or multiple-collector transistors which are fed close to (order of magnitude of one diffusion length) their emitter-base junctions by the injection of minority charge carriers inside the semiconductor body.

A basic structure of this logic concept, as described in the aforementioned U.S. patents, is made up in such a manner that zones of the second conductivity type, which serve as emitter and collector zones of a lateral transistor structure, are arranged spaced from each other in a semiconductor layer of a first conductivity type and that the collector zone of the lateral transistor structure includes at least one further zone of a conductivity type opposite thereto, which serves as a collector zone of an inversely operated vertical, complementary transistor structure. The collector zone of the lateral transistor structure simultaneously forms the base zone of the vertical transistor structure. The base zone of the lateral and the emitter zone of the inversely operated vertical transistor structure are formed by the semiconductor layer of the first conductivity type. For operating this semiconductor structure as a logical basic circuit, a current is impressed into the emitter zone of the lateral transistor structure, which as a function of the input signal applied to the collector zone of the lateral and the base zone of the vertical transistor, respectively, controls the current supplying the inverted output signal through the vertical transistor structure. By merging the zones of the same doping and connected to the same potential, a structure of optimum integration is obtained, the manufacture of which requires only two diffusion processes in the embodiment described.

Other known examples of this basic circuit include a layer structure with four zones of different conductivity types, which comprise two vertical, monolithically merged transistor structures and which are suitably operated. In this case, minority charge carriers are also injected via the emitter zone of one transistor, which causes current to be supplied to the basic circuit, while the output signal is supplied via the other transistor structure.

The inverting, logical basic circuits described are most suitable for the design of logical circuits and are equally suitable as componenets for monolithically integrated storage cells. Such storage cells are used in particular in digital data processing systems. The storage cells are arranged in a matrix, so that via corresponding selection means each cell can be addressed, while data are written into or read from it.

It is known that inverting logical circuits require two stages to obtain storage cells in the manner of bistable multivibrators and flip-flops, respectively. Thus, a storage cell includes two such basic circuits which are symmetrically designed and whereby the output of one circuit is connected to the input of the other to provide a feedback condition. In this manner, the necessary cross-coupling, as exists in the usual flip-flops, is obtained.

From German OS 2 307 739 [(FI 9-71-084) - U.S. Pat. No. 3,815,106] a storage cell is known which includes two of the logical basic circuits described and in which the collector of the inverting transistor of one basic circuit is in each case connected to the base of the inverting transistor of the other basic circuit. The two inverting transistors are inversely operated, forming the actual flip-flop transistors. The complementary transistors of the two basic circuits, via which the injection of minority charge carriers and thus the power supply is effected and which are connected via a separate line, serve as load elements for both flip-flop transistors. For the purpose of addressing, that means for writing and reading a storage cell, the base of each flip-flop transistor is additionally connected to the emitter of an associated additional addressing transistor which is also complementary and whose collector is connected to the associated bit line, and whose base is connected to the address line. In addition to the injecting transistor forming the load element, a further addressing transistor is necessary which is also formed by a lateral transistor structure.

Proceeding from the known inverting logical basic circuit, German OS 2 612 666 [(GE 9-76-005) United Kingdom Patent Application No. 8700/77 filed Mar. 2, 1977 and published as Publication No. 1 569 800 on June 18, 1980] concerns an improved basic circuit which particularly, because of its operation offers considerable advantages in connection with logical circuits and which by means of sense circuits largely reduces the load imposed on the actual signal path. This is accomplished by sensing the conductive state of the inverting transistor of the basic "Integrated Injection Logic" ($I^2L$) circuit with the aid of a sense circuit incorporated in the injection current circuit and thus in the operating current circuit. This sensing is effected as a function of the current reinjected into the injection zone with a conductive inverting transistor. When this principle, as is also described in the afore-mentioned Offenlegungsschrift, is used in a circuit including two such circuits connected in the form of a flip-flop to serve as a storage cell, both the supply of the operating current and the coupling of the read/write signals are effected via bit lines connected to the injection zone. In this manner no separate addressing transistors are required, and the additional injection zone necessary for the known storage cell is eliminated.

Certain problems may be encountered with the $I^2L$ basic circuit described in the afore-mentioned Offenlegungsschrift and the storage cell produced with its aid, if importance is attached to minimum dimensions for the structure and thus to maximum integration density. These minimum dimensions, i.e., the minimum area requirements obtainable for an $I^2L$ basic circuit, are, for technological reasons, essentially a function of the minimum dimensions obtainable for the contact and diffusion windows in the photolithographic processes used during manufacture.

An $I^2L$ structure manufactured in accordance with the ground rules determined by the technology applied and aimed at minimum area requirements is characterized in that the facing injecting and reinjecting edges of the lateral transistor are of the shortest possible length. This edge length determines the efficiency of the injection and reinjection of the minority charge carriers. In other words, this edge length determines the current amplification of the lateral transistor in the forward and the backward direction.

When the $I^2L$ basic circuit is used in storage cells designed in the manner of a flip-flop, these current amplifications may be too low to obtain reliably operating storage arrangements.

This becomes apparent from the fact that during the sensing of the conductive state of the inverting transistor the signal supplied on the injection zone, as a result of charge carriers being reinjected by the conductive transistor, may be too weak to provide a clearly defined read signal.

SUMMARY OF THE INVENTION

This is remedied by means of the invention. The invention, as characterized in the numbered paragraphs immediately hereafter, solves this problem by providing a monolithically integrated storage arrangement with storage cells arranged in a matrix, which comprise two cross-coupled $I^2L$ structures in the manner of a flip-flop, wherein the read signal is derived from the charge carrier current reinjected into the respective injection zone associated with the respective conductive inverting transistor, thus ensuring an adequate read signal in spite of structures with minimum area requirements.

No. 1. A monolithically integrated storage arrangement with storage cells arranged in a matrix, which comprise two $I^2L$ structures each made up of an injector (P1, P1') and an associated inverting transistor (T1, T1') and connected in the form of a flip-flop by a cross-coupling between the collector (N2 and N2', respectively,) of one transistor and the base (P2' and P2, respectively,) of the other inverting transistor, the operating current and the read/write currents of the storage cells of a matrix column being applied via a bit line pair (BL0, BL1) connected to the injectors (P1, P1') of said storage cells, and the selection of the storage cells of a matrix line being effected via a common address line (X) coupled to the emitters (N1, N1') of the inverting transistors (T1, T1') of said storage cells, characterized in that the emitters (N1) of the inverting transistors (T1) of one I²L structure of the storage cells of each matrix line are connected to a first partial address line (X1) and the emitters (N1') of the inverting transistors (T1') of the other I²L structure are connected to a second partial address line (X2), and that each of the two partial address lines (X1, X2) subsequent to each group of storage cells (1 to m) is connected to the common address line (X) via a resistor (RX).

No. 2. A monolithically integrated storage arrangement in accordance with paragraph No. 1 supra, characterized in that each I²L structure comprises an inversely operated vertical transistor structure as an inverting transistor (T1, T1') and a zone serving as an injection (P1, P1') and emitter zone, respectively, of a transistor (T2, T2') complementary to said inverting transistor, the collector of the former transistor simultaneously forming the base (P2, P2') and the base of the former transistor simultaneously forming the emitter (N1, N1') of the inverting transistor (T1, T1').

No. 3. A monolithically integrated storage arrangement in accordance with paragraph No. 2 supra, characterized in that a semiconductor layer of the opposite second conductivity type applied to a substrate (P—) of a first conductivity type is subdivided into parallel stripes (N1, N1') by first isolation zones (IZ1) extending in line direction in each matrix line, said stripes respectively forming the emitters of the inverting transistors (T1, T1') and the bases of the complementary transistors (T2, T2') of the corresponding halves of the storage cells of the respective matrix line, that the partial address lines (X1, X2) are made up of buried highly doped zones (N1+ and N1'+, respectively) extending alongside the parallel stripes (N1, N1'), and that the common address line (X) is formed by one additional conductor for each matrix line.

No. 4. A monolithically integrated storage arrangement in accordance with paragraph No. 3 supra, characterized in that the adjoining I²L structures in a matrix line are separated from each other by second isolation zones (IZ2) extending in column direction and not fully interrupting the appertaining buried highly doped zones (N1+, N1'+).

No. 5. A monolithically integrated storage arrangement in accordance with paragraph No. 3 or No. 4 supra, characterized in that the buried highly doped zones (N1+, N1'+) forming the partial word lines (X1, X2) are interrupted subsequent to each group of storage cells, so that the sheet resistor of the region of the semiconductor layer (N1, N1') arranged between two adjacent isolation zones (IZ2) of the second type form a resistor (RX) connecting the partial address line (X1, X2) to the common address line (X).

No. 6. A monolithically integrated storage arrangement in accordance with paragraph No. 5 supra, characterized in that the terminal of the resistor (RX) is formed by the end of the buried highly doped zone (N1+, N1'+) obtained by interruption, and that the other terminal is formed by a highly doped zone (N+) which is embedded in the region of the semiconductor layer (N1, N1') forming the sheet resistor, and which is connected to the common address line (X).

BRIEF DESCRIPTION OF THE DRAWINGS

One way of carrying out the invention will be described in detail below with reference to the drawings which illustrate only one specific embodiment.

The foregoing and other objects, features and advantages of the invention will be apparent from the following more particular description of the present invention as illustrated in the accompanying drawings, wherein:

FIG. 1A is a sectional view of the structure of the known I²L basic circuit;

FIG. 1B is a circuit diagram of the structure in accordance with FIG. 1A;

FIG. 2 is a block diagram of a section of a matrix line of a storage arrangement in accordance with the invention;

FIG. 3 is a circuit diagram of two adjacent storage cells in a matrix line of the storage arrangement in accordance with the invention;

FIG. 4A is a plan view of a section of the integrated structure of the storage arrangement in accordance with the invention, which comprises two storage cells of a line;

FIG. 4B is a sectional view taken along line 4B—4B of the structure in accordance with FIG. 4A, and FIG. 4C is a sectional view taken along line 4C—4C of the structure in accordance with FIG. 4A.

DESCRIPTION OF THE PREFERRED EMBODIMENT

The semiconductor structure shown in the sectional view of FIG. 1A includes the basic structure of the logical basic circuit known as "Integrated Injection Logic". The typical layout as well as the operation of this structure are described in detail in the afore-mentioned literature, so that not more than a summarizing description need be given here. The references are chosen in such a manner that they simultaneously indicate the conductivity type.

As a starting material a lightly doped semiconductor substrate P— of a first conductivity type, for example, of the P conductivity type, is used. On the semiconductor substrate a heavily doped buried zone N1+ of the opposite conductivity type is arranged. On top of the buried zone N1+, an N doped epitaxially applied semiconductor layer N1 is arranged. Two oppositely doped zones P1 and P2 are introduced at a particular spacing into the semiconductor layer N1. Zone P2 has formed therein a further oppositely doped zone N2. This structure is surrounded by a recessed dielectric isolation zone IZ. It is possible to use a junction isolation in lieu of this dielectric isolation.

The electrical circuit diagram of the structure described so far is shown in FIG. 1B. The identical designations used for the various identical zones permit a direct comparison between the structure and the circuit diagram.

Accordingly, the basic circuit used in accordance with the invention essentially includes an inverting transistor T1 with the zone sequence N2, P2, N1, which is fed by the direct injection of minority charge carriers. The inverting transistor T1 is designed as an inversely operated, vertical transistor. For the purpose of injecting minority charge carriers, a transistor T2 complementary thereto with the zone sequence P1, N1, P2 is provided, which is laterally designed in the structure considered. Both transistors are merged with each other at maximum integration by combining common semiconductor zones connected to the same potential. The semiconductor layer N1 simultaneously serves as a base zone of the lateral transistor T2 and as an emitter zone of the vertical transistor T1. The injection zone P1 forms the emitter zone of the transistor T2. The zone P2 simultaneously forms the base zone of the vertical, inverting transistor T1 and the collector zone of the injecting lateral transistor T2. The zone N2 forms the collector zone of the inverting transistor T1. On zone P1, forming the emitter zone of the injecting transistor, an injector terminal I is arranged, via which current is externally applied. This current supplies the base current for the inverting transistor T1. On zone P2, forming the base zone of the latter transistor, a control terminal S is provided, via which the conductive state of the inverting transistor T1 can be switched. On zone N2 the collector terminal O is arranged which simultaneously forms the output of the inverting basic circuit. The conductive state of the inverting transistor T1, which is determined by the control signal on control terminal S, can be sensed via an injection path, that means a sense circuit, not shown, connected to the current supply. For this purpose, advantage is taken of the fact that with inverting transistor T1 being conductive, the base zone P2 simultaneously acts as an emitter, reinjecting a current opposite to the normal injection current and supply current, respectively, into the actual injection zone P1 of the lateral transistor T2. Thus, the current flowing across the injection terminal I with inverting transistor T1 being conductive has a lower value than with a blocked transistor, proceeding from the same base-emitter voltage VBE. This current difference can be sensed by means of a conventional sense circuit. The fact of reinjection with a conductive transistor T1 is indicated in the equivalent circuit diagram by the parallel transistor structure illustrated by broken lines, in addition to the normal transistor T2. Thus, in the parallel transistor structure the collector and emitter are interchanged. The sense circuit can be designed in such a manner that it detects either the current difference or a corresponding voltage difference. This permits sensing the conductive state of the inverting transistor T1, without additional lines or semiconductor zones being required in the existing basic structure.

FIG. 2 will be dealt with in detail below. The essential feature characterizing the invention may be seen from the schematically represented matrix line of a storage arrangement in accordance with the invention, as illustrated in said figure.

The illustrated section of the matrix line includes, for example, two groups of storage cells 1 to m and 1' to m'. The groups are subdivided in such a manner that upon addressing only one storage cell is selected from each group.

As will be described in detail below, the storage cells take the form of two I²L structures each which are connected in the manner of a flip-flop, as has been previously described by means of FIGS. 1A and 1B. One bit line pair BLO1, BL11 to BL0m BL1m and BL01', respectively, BL11' to BL0m', BL1m' is associated with each storage cell. Each bit line pair defines one column of the storage matrix. In addition, a common address line X is provided for the storage cells of a line. The read/write signals from the associated read/write circuits W/R are supplied via the bit lines. Actual addressing is effected via the address line X connected to a line driver W.

The problem that the read signals sensed by the differential amplifiers included in the read/write circuits are relatively weak with the kind of storage cell considered, is solved by subdividing the existing common address line X into two partial address lines X1 and X2 which subsequent to each defined group of storage cells are connected to the common address line X via a resistor RX. The result obtained by subdividing the address line in this manner will be described below by means of FIG. 3. The circuit diagram shows two adjacent storage cells 1 and 2 of a matrix line defined by the address line X.

As previously stated, each cell comprises two I²L basic circuits in accordance with FIGS. 1A and 1B. As in FIGS. 1A and 1B, the individual semiconductor zones are provided with identical references, the designations of one of the two basic circuits being provided with a superscript for ready distinction. Thus, the storage cell is designed in the manner of a flip-flop. The two inverting transistors T1 and T1' from the actual flip-flop transistors, the collector of the inverting transistor of one basic circuit being connected to the base of the inverting transistor of the other basic circuit. In this manner, the two inverting basic circuits are fed back to each other. The transistors T2 and T2' of the two basic circuits respectively form the injecting and reinjecting transistor of the associated complementary inverting transistor T1 and T1'. The injector terminal I (see FIGS. 1A and 1B) of each basic circuit is connected to an associated bit line BL0 or BL1 of a corresponding bit line pair. The emitters of the inverting transistors T1, which in each case, form one flip-flop half, are connected to the first partial address line X1, while the emitters of the inverting transistors T1', which form the other flip-flop half, are connected to the second partial address line X2. Subsequent to the group of storage cells already defined, the two partial address lines are connected to the common address line X via one resistor RX each.

The operation of a storage cell in accordance with the invention will be described in detail below by means of FIG. 3, initially assuming that there is only one common address line X to which the emitters of all inverting transistors T1 and T1', respectively, of a matrix line are connected. In the standby state, the address line X is connected to a potential of 0.5 V, for example. The two bit lines BL0 and BL1 leading up to the storage cell considered have the same potential which is about 0.7 V higher than that of the word line X referred to. If the current amplification of the inverting transistors T1 and T1' in emitter block circuit is greater than 1, the flip-flop assumes a stable state, for which purposes a very small cell standby current can be chosen.

For addressing the storage cell, the potential of the address line X is lowered by several 100 mV, for example, to 0 V.

A write operation is extremely easy to implement. After the potential of the word line X has been lowered, a current is applied to one of the two bit lines. If, for example, the flip-flop transistor T1 of the cell 1 is to be switched to the conductive state, only the bit line BL0 of the corresponding matrix line receives a current. A large part of this current flows into the base zone of the flip-flop transistor T1, thus switching the latter on and defining the storage state of the storage cell.

A read operation is effected in that, in addition to lowering the potential of the address line X, the same potential is impressed into both bit lines concerned. For this purpose, the potential is preferably chosen in such a manner that the currents flowing in the storage cell are higher than in the standby state, to obtain a higher speed. The non-selected storage cells connected to the same bit line pair are practically disconnected from the power supply, as the emitter-base voltage of the corresponding lateral transistors is several 100 mV lower than the emitter-base voltage of the inverting flip-flop transistors T1, T1' of the selected address line X. As a result of the load stored in the flip-flop transistor capacitances, the information of the non-selected storage cells is maintained for a long time compared to the time required for reading. Assuming a storage state of the selected cell in which the transistor T1 is conductive and the transistor T1' is blocked, then a current is fed back to the bit line BL0 by reinjection, while no current is applied to bit lin BL1. Thus, different currents flow in the two bit lines. This current difference can be measured by means of a sense circuit in the form of a low-resistance amplifier and is indicative of the storage state of the storage cell considered.

Reading can also be effected by using impressed currents on the bit lines in lieu of impressed voltages. In such a case, a voltage difference occurs on the bit lines, which can be amplified by means of a connected differential amplifier and which supplies a signal characterizing the storage state of the storage cell.

A storage cell operated in that manner has a high density, extremely low power dissipation and a high stability. A disadvantage is the relatively small read signal (about 15 to 30 mV) which occurs above all at high read currents because of the decreasing current amplification. This leads to the circuits being subject to very tough requirements, to ensure that the bit line potentials supplied following a read operation are as similar as possible, and impairs the read speed and the noise distance during reading. The read signal which is quite low as it is reduced further as the read current increases, so that the read current has to be limited to relatively small values in the interest of a satisfactory read operation. To eliminate this disadvantage, the address line X is subdivided in accordance with the invention into two partial address lines X1 and X2 which subsequent to several cells are reconnected to the common address line X via a resistor RX.

A read operation will be described below.

It is assumed that out of a group of m cells between two word line terminals only one storage cell is selected at a particular time, i.e., is fed with bit line currents IL. In the example of FIG. 3, the cell concerned is storage cell 1. The left flip-flop transistor T1 is assumed to be conductive, while the right flip-flop transistor T1' is blocked. In such a case, the current IX2 on the partial address line X2 consists only of the base current IB2' of the non-saturated lateral transistor T2' and is obtained at a rate of:

$IX = IL \cdot (l - \alpha N)$, where $\alpha N$ is the forward current amplification of the lateral transistor T2' in base block circuit.

The difference of the total current (2IL) applied to the storage cell and the current IX2, which amounts to $IXL = 2 \cdot IL - IX2 = IL \cdot (l + \alpha N)$, flows in the partial word line X1.

The two currents IX1 and IX2 on the partial word lines X1 and X2 thus generate a voltage difference of $\Delta VX = RX \cdot IL[(l + \alpha N) - (l - \alpha N] = RX \cdot IL \cdot 2 \cdot \alpha N$ between the two partial word lines X1 and X2.

A read current of $\Delta VS = \Delta VSO + 2 \cdot RX \cdot IL \cdot \alpha N$, where $\Delta VSO$ is the read signal for an undivided common word line X, occurs at the selected storage cell 1 between the two bit lines BL0 and BL1.

Thus, the read signal can be considerably increased by suitably dimensioning the resistors RX and the bit line currents IL. Care must be taken, however, that the voltage difference $\Delta VX$ between the two partial word lines X1 and X2 is always smaller than the voltage difference between the two cross-coupling points. This voltage is of the order of 700 mV.

In this manner, the read signal can be increased to several 100 mV, so that the problems described in connection with the storage arrangement are eliminated. For a desired read current (bit line current) IL=200μA, for example, and $\Delta VX = 200$ mV the resistacne value RX obtained is about 1 to 2k ohm (depending upon the value $\alpha N$). For a uniform distribution of the standby current of the storage cells this value is sufficiently small, so that even with the most unfavorable bit pattern the standby current supply is not affected. For 16 cells, for example, with an injector standby current of 100 nA each there is only a voltage difference of $\Delta VX < 16 \cdot 0.1$ μA·1 k ohm = 1.6 mV between the two injectors P1 and P1'.

An embodiment of the monolithic layout of a storage arrangement in accordance with the invention is illustrated in the plane view of FIG. 4A showing a section comprising two adjacent storage cells of a matrix line, and in the sectional views of FIGS. 4B and 4C. Thus, this section comprises the two storage cells shown in the equivalent circuit diagram of FIG. 3. In this case, too, identical references are used for the individual semiconductor zones, so that the I²L basic structure of FIGS. 1A and 1B, the section comprising two storage cells, as illustrated in the equivalent circuit diagram of FIG. 3, and the integrated structure shown in FIG. 4, may be readily related to each other. Accordingly, each storage cell is made up of two I²L structures, as illustrated in FIGS. 1A and 1B. The two basic structures forming a storage cell are separated from each other by an isolation zone IZ1. The monolithic layout consists in an epitaxial layer N1 being applied to a semiconductor substrate P−. This epitaxial layer N1 is subdivided in the form of stripes by the isolation zone IZ1 extending in line direction. Thus, a matrix line comprises two such stripe-shaped regions N1 and N1' which are insulated against each other by means of an isolation zone IZ1. These isolation zones are preferably dielectric zones extending into the substrate P−; it is also possible to provide deep P zones. Each of the two regions N1 and N1' comprises a continuous buried zone N1+ and N1'+, respectively, which extends in line direction and which is common to one cell half of all storage cells of a matrix line. These buried, highly conductive zones N1+ and N1'+, respectively, form the two partial address lines X1 and X2 which are provided for the storage cells of each matrix line. The two I²L basic structures forming a storage cell are arranged one below the other in column direction and comprise, as shown in FIGS. 1A and 1B and FIG. 3, respectively, two zones P1 (P1') and P2 (P2') arranged laterally to each other in the epitaxial layer N1 (N1'), and a further zone N2 (N2') in the zone P2 (P2'). In this manner, the storage cell with the vertical transistors T1 and T1' with the zone sequences N2P2N1 and N2'P2'N1', respectively, and the associated lateral transistors T2 and T2' with the zone sequences P1N1P2 and P1'N1'P2', respectively, effecting the injection is obtained. In the illustrated embodiment, the cell halves are preferably staggered relative to each other in such a manner that the conductors M1 and M2 to be provided between the zones P2 and N2' and P2' and N2, respectively, and forming the cross-coupling extend parallel to each other and in column direction, thus being of minimum length. In addition, one bit line pair BL0, BL1 is provided for each matrix column. This bit line pair is connected to the associated zones P1 and P1', respectively of the injecting transistors T2 and T2', respectively, of all storage cells arranged in a matrix column. Adjacent storage cells of a matrix line are separated from each other by one dielectric isolation zone IZ2 each which extends perpendicularly to the isolation zones IZ1 merging therewith. In contrast to isolation zones IZ1, isolation zones IZ2 do not extend into the substrate P but extend only slightly into the highly doped zones N1+ and N1'+ which form the partial word lines X1 and X2 and which must be continuous for all storage cells of a matrix line. The isolation zone IZ2 prevents parasitic couplings between the cell components of two adjacent storage cells in a matrix line. The bit lines BL0 and BL1 as well as the conductors M1 and M2 effecting the cross-coupling are arranged on an isolating layer IS covering the whole surface of the arrangement. Via contact windows arranged in isolation layer IS, the conductors are connected to the appertaining semiconductor zones.

The resistors RX to be provided in accordance with the invention and which subsequent to a group of storage cells connect the common word line X to the partial word lines X1 and X2 can be easily realized by suitably interrupting the buried zone N1+ and N1'+, respectively, as shown in FIGS. 4A and 4B, right margin. The region of the epitaxial layer N1 and N1', respectively, thus defined between two isolation zones IZ2 forms the resistors RX in the form of a sheet resistor. One terminal of these resistors is formed by the respective end of the highly doped zones N1+ and N1'+, respectively, while the other end is formed by a highly doped terminal zone N+ and N+', respectively, introduced into the zone N1 and N1' respectively. The common address line X, which is only roughly outlined in FIGS. 4A and 4B, is preferably arranged in a second metallization plane and consists of one conductor per matrix line. The partial address lines X1 and X2 are connected to the address line X via a contact linked with the terminal zones N+ and N+', respectively.

In summary, the invention has the following advantages: by subdividing the address line, a very high read signal is obtained which reduces the requirements to which the read amplifier is subject and ensures a higher read speed as well as a greater noise tolerance with regard to parasitic read currents of the non-selected storage cells.

While the invention has been described and shown particularly with reference to one of its preferred embodiment, it will be understood by those skilled in the art to which the work is directed that various changes in form and detail may be made without departing from either the spirit or scope of the invention.

We claim:

1. A monolithically integrated storage arrangement with storage cells arranged in a matrix, which comprise two I²L structures each made up of an injector (P1, P1') and an associated inverting transitor (T1, T1') and connected in the form of a flip-flop by a cross-coupling between the collector (N2 and N2', respectively) of one transistor and the base (P2' and P2, respectively) of the other inverting transistor, the operating current and the read/write currents of the storage cells of a matrix column being applied via a bit line pair (BL0, BL1) connected to the injectors (P1, P1') of said storage cells, and the selection of the storage cells of a matrix line being effected via a common address line (X) coupled to the emitters (N1, N1') of the inverting transistors (T1, T1') of said storage cells, characterized in that the emitters (N1) of the inverting transistors (T1) of one I²L structure of the storage cells of each matrix line are connected to a first partial address line (X1) and the emitters (N1') of the inverting transistors (T1') of the other I²L structure are connected to a second partial word line (X2), and that each of the two partial address lines (X1, X2) subsequent to each group of storage cells (1 to m) is connected to the common address line (X) via a resistor (RX).

2. A monolithically integrated storage arrangement in accordance with claim 1, characterized in
that each I²L structure comprises an inversely operated vertical transistor structure as an inverting transistor (T1, T1') and a zone serving as an injection (P1, P1') and emitter zone respectively, of a transistor (T2, T2') complementary to said inverting transistor, the collector of the former transistor simultaneously forming the base (P2, P2') and the base of the former transistor simultaneously forming the emitter (N1, N1') of the inverting transistor (T1, T1').

3. A monolithically integrated storage arrangement in accordance with claim 2, characterized in
that a semiconductor layer of the opposite second conductivity type applied to a substrate (P−) of a first conductivity type is subdivided into parallel stripes (N1, N1') by first isolation zone (IZ1) extending in line direction in each matrix line, said stripes respectively forming the emitters of the inverting transistors (T1, T1') and the bases of the complementary transistors (T2, T2') of the corresponding halves of the storage cells of the respective matrix line, that the partial address lines (X1, X2) are made up of buried highly doped zones (N1+ and N1'+, respectively) extending alongside the parallel stripes (N1, N1'), and that the common address line (X) is formed by one additional conductor for each matrix line.

4. A monolithically integrated storage arrangement in accordance with claim 3, characterized in
that the adjoining I²L structures in a matrix line are separated from each other by second isolation zones (IZ2) extending in column direction and not fully interrupting the appertaining buried highly doped zones (N1+, N1'+).

5. A monolithically integrated storage arrangement in accordance with claim 3 or 4, characterized in
that the buried highly doped zones (N1+, N1'+) forming the partial word lines (X1, X2) are interrupted subsequent to each group of storage cells, so that the sheet resistor of the region of the semiconductor layer (N1, N1') arranged between two adjacent isolation zones (IZ2) of the second type form a resistor (RX) connecting the partial address line (X1, X2) to the common address line (X).

6. A monolithically integrated storage arrangement in accordance with claim 5, characterized in
that the terminal of the resistor (RX) is formed by the end of the buried highly doped zone (N1+, N1'+)

obtained by interruption, and that the other terminal is formed by a highly doped zone (N+) which is embedded in the region of the semiconductor layer (N1, N1') forming the sheet resistor, and which is connected to the common address line (X).

7. In a monolithic memory employing merged transistor logic (MTL) memory cells, said monolithic memory comprising:

at least first and second identical memory cells, each of said at least first and second memory cells including first and second NPN transistors (T1, T1') and first and second PNP transistors (T2, T2'), each of said NPN and PNP transistors including an emitter, base and collector; first connection means connecting said collector of said first PNP transistor (T2) to said base of said first NPN transistor (T1) and said collector of said second PNP transistor (T2') to said base of said second NPN transistor (T1');

a first bit line pair having a first bit line (BL0) and a second bit line (BL1), said first bit line of said first bit line pair being connected to said emitter of said first PNP transistor (T2) of said first memory cell, said second bit line of said first bit line pair being connected to said emitter of said second PNP transistor (T2') of said first memory cell;

a second bit line pair having a first bit line (BL0) and a second bit line (BL1), said first bit line of said second bit line pair being connected to said emitter of said first PNP transistor (T2) of said second memory cell, said second bit line of said second bit line pair being connected to said emitter of said second PNP transistor (T2') of said second memory cell;

first and second partial word lines (X1, X2), said first partial word line (X1) being connected to said emitter of said first NPN transistor (T1) of said first memory cell, said base of said first PNP transistor (T2) of said first memory cell, said emitter of said first NPN transistor (T1) of said second memory cell and said base of said first PNP transistor (T2) of said second memory cell and said second partial word line (X2) being connected to said emitter of said second NPN transistor (T1') of said first memory cell, said base of said second PNP transistor (T2') of said first memory cell, said emitter of said second NPN transistor (T1') of said second memory cell and said base of said second PNP transistor (T2') of said second memory cell;

word line driver circuit means;

a word line connected to said word line driver circuit means;

first resistive circuit means connecting said first partial word line (X1) to said word line;

second resistive circuit means connecting said second partial word line (X2) to said word line; and read/write circuit means connected to said first and second bit line pairs.

8. In a monolithic memory employing merged transistor logic (MTL) memory cells, said monolithic memory comprising:

one through m identical memory cells, where m is a positive integer;

one through m bit line pairs, each of said bit line pairs including a first bit line and a second bit line, each of said one through m bit line pairs being connected to a predetermined one of said one through m memory cells;

a first partial word line being discretely connected to each of said one through m memory cells;

a second partial word line being discretely connected to each of said one through m memory cells;

a common word line circuit means connecting said first and second partial word lines to said common word line; and read/write circuit means connected to said one through m bit line pairs.

9. In a monolithic memory employing merged transistor logic (MTL) memory cells, as recited in claim 8 wherein each of said one through m identical memory cells comprises:

a first PNP transistor (T2) having an emitter region (P1), a base region (N1) and a collector region (P2):

a first NPN transistor (T1) having an emitter region (N1), a base region (P2) and a collector region (N2);

a second PNP transistor (T2') having an emitter (P1'), a base region (N1') and a collector region (P2');

a second NPN transistor (T1') having an emitter region (N1'), a base region (P2') and a collector region (N2');

first passive connection means connecting said collector region (N2) of said first NPN transistor to said base region (P2') of said second PNP transistor; and second passive connection means connecting said collector region (N2') of said second NPN transistor to said base region (P2) of said first PNP transistor.

10. In a monolithic memory employing merged transistor logic (MTL) memory cells, as recited in claim 9, wherein said first bit line of said bit line pair is connected to said emitter region (P1) of said first PNP transistor (T2) and said second bit line of said bit line pair is connected to said emitter region (P1') of said second PNP transistor (T2').

11. In a monolithic memory employing merged transistor logic (MTL) memory cells, as recited in claim 10, wherein said first partial word line is connected to said base region (N1) of first PNP transistor (T2) and said emitter region (N1) of said first NPN transistor (T1) of each of said one through m identical memory cells; and said second partial word line is connected to said base region (N1') of said second PNP transistor (T2') and said emitter region (N1') of said second NPN transistor (T1') of each of said one through m identical memory cells.

12. In a monolithic memory employing merged transistor logic (MTL) memory cells as recited in claim 11, wherein said first and second partial word lines are respectively provided by discrete first and second N type semiconductor regions, said first and second discrete semiconductor regions being integrally formed with said one through m identical memory cells.

13. In a monolithic memory employing merged transistor logic (MTL) memory cells, as recited in claim 12, wherein said circuit means connecting said first and second partial word lines to said common word line comprises at least one N type semiconductor region.

14. In a monolithic memory employing merged transistor logic (MTL) memory cells, as recited in claim 8, wherein each of said one through m identical memory cells includes cross coupled first and second merged transistor logic circuits, said first and second merged transistor logic circuits each having a PNP transistor and an NPN transistor, said collector of said PNP transistor and said base of said NPN transistor being provided in common by a single region of P type semiconductor material, and said base of said PNP transistor and said emitter of said NPN transistor being provided in common by a single region of N type semiconductor material.

* * * * *

UNITED STATES PATENT AND TRADEMARK OFFICE
CERTIFICATE OF CORRECTION

PATENT NO. : 4,346,458
DATED : Aug. 24, 1982
INVENTOR(S) : Horst H. Berger and Siegfried K. Wiedmann It is certified that error appears in the above-identified patent and that said Letters Patent is hereby corrected as shown below:

| | |
|---|---|
| Column 1, lines 11-12 | delete "(GE 9-78-021). |
| Column 1, line 15 | delete "and" and insert --a comma (,)--. |
| | "herewith." should read --herewith, and granted as U.S. Patent No. 4,280,198 on July 21, 1981.--. |
| Column 1, lines 16-17 | delete "(GE 9-78-036)". |
| Column 1, line 20 | delete "and". |
| Column 1, line 21 | "herewith." should read --herewith, and allowed April 14, 1981.--. |
| Column 1, lines 22-23 | delete "(GE 9-79-004". |
| Column 1, line 25 | delete "and". |
| | "herewith." should read --herewith, and granted as U.S. Patent No. 4,313,179 on January 26, 1982.--. |
| Column 1, line 26 | delete "(FR". |
| Column 1, line 27 | delete "9-77-301 - French Patent Application 77/29867)". |

UNITED STATES PATENT AND TRADEMARK OFFICE
CERTIFICATE OF CORRECTION

PATENT NO. : 4,346,458
DATED : Aug. 24, 1982
INVENTOR(S) : Horst H. Berger and Siegfried K. Wiedmann It is certified that error appears in the above-identified patent and that said Letters Patent is hereby corrected as shown below:

| | |
|---|---|
| Column 1, line 30 | delete "and". |
| Column 1, lines 30-31 | "herewith." should read --herewith, and granted as U.S. Patent No. 4,277,701 on July 7, 1981.--. |
| Column 1, lines 41-42 | delete "(GE 9-78-005)". |
| Column 1, line 45 | delete "and". |
| | "herewith." should read --herewith, and granted as U.S. Patent No. 4,259,730 on March 31, 1981.--. |
| Column 1, line 56 | delete "The Lohrey et al patent discloses an associative". |
| Column 1, lines 57-68 | delete said lines. |
| Column 2, lines 1-6 | delete said lines. |
| Column 2, line 10 | delete "The Berger et". |
| Column 2, lines 11-20 | delete said lines. |
| Column 2, line 24 | delete "The Wied-". |
| Column 2, lines 25-30 | delete said lines. |

UNITED STATES PATENT AND TRADEMARK OFFICE
CERTIFICATE OF CORRECTION

PATENT NO. : 4,346,458
DATED : Aug. 24, 1982
INVENTOR(S) : Horst H. Berger and Siegfried K. Wiedmann It is certified that error appears in the above-identified patent and that said Letters Patent is hereby corrected as shown below:

| | |
|---|---|
| Column 2, line 33 | delete "The". |
| Column 2, lines 34-45 | delete said lines. |
| Column 2, line 48 | delete "The". |
| Column 2, lines 49-62 | delete said lines. |
| Column 2, line 64 | delete "The Sinclair". |
| Column 2, lines 65-68 | delete said lines. |
| Column 3, lines 1-2 | delete said lines. |
| Column 3, line 5 | delete "The Peterson patent". |
| Column 3, lines 6-14 | delete said lines. |
| Column 3, line 18 | delete "The Berger et al patent". |
| Column 3, lines 19-31 | delete said lines. |
| Column 3, line 35 | delete "The Wiedmann patent discloses a monolithi-". |
| Column 3, lines 36-43 | delete said lines. |
| Column 3, line 46 | delete "The ABSTRACT of". |
| Column 3, lines 47-59 | delete said lines. |
| Column 3, line 61 | delete "(GE 9-76-005)." |

UNITED STATES PATENT AND TRADEMARK OFFICE
CERTIFICATE OF CORRECTION

PATENT NO. : 4,346,458
DATED : Aug. 24, 1982
INVENTOR(S) : Horst H. Berger and Siegfried K. Wiedmann It is certified that error appears in the above-identified patent and that said Letters Patent is hereby corrected as shown below:

| | |
|---|---|
| Column 3, line 66 | delete "(GE". |
| Column 3, line 67 | delete "8-77-0015)". |
| Column 4, line 4 | "pages 341-346" should read --pages 340-346--. |
| Column 4, line 39 | "pp 340 ff and 346 ff should read --pages 340 through 351--. |
| Column 5, line 31 | delete "[(FI9-71-084)". |
| | "U.S. Pat." should read --[U.S. Pat.--. |
| Column 5, line 54 | delete "[GE9-76-005)". |
| | "United" should read --[United--. |
| Column 6, line 43 | This line should read "The problem identified above is remedied by means of the invention. The". |
| Column 8, lines 3-5 | delete said lines. |
| Column 9, line 6 | after "vertical" delete --,--. |
| Column 9, line 61 | delete "respectively". |
| Column 11, line 17 | change "lin" to --line--. |

UNITED STATES PATENT AND TRADEMARK OFFICE
CERTIFICATE OF CORRECTION

PATENT NO. : 4,346,458

DATED : Aug. 24, 1982

INVENTOR(S) : Horst H. Berger and Siegfried K. Wiedmann

It is certified that error appears in the above-identified patent and that said Letters Patent is hereby corrected as shown below:

Column 11, line 67   change "(1-aN]" to read --(1-aN)].

Column 12, line 16   change "resistacne" to --resistance--.

Column 16, line 28   change "PNP" to --NPN--.

Column 16, line 31   change "PNP" to --NPN--.

Signed and Sealed this

Seventh Day of August 1984

[SEAL]

Attest:

GERALD J. MOSSINGHOFF

Attesting Officer

Commissioner of Patents and Trademarks